United States Patent
Kamada (10) Patent No.: US 8,722,476 B2
(45) Date of Patent: May 13, 2014

(54) COMPOUND SEMICONDUCTOR DEVICE AND MANUFACTURE PROCESS THEREOF

(75) Inventor: Yoichi Kamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/291,576

(22) Filed: Nov. 8, 2011

(65) Prior Publication Data

US 2012/0146134 A1 Jun. 14, 2012

(30) Foreign Application Priority Data

Dec. 10, 2010 (JP) .................. 2010-276317

(51) Int. Cl.
*H01L 21/338* (2006.01)

(52) U.S. Cl.
USPC .......................... 438/172; 257/194

(58) Field of Classification Search
USPC .......................... 257/194; 438/172
See application file for complete search history.

(56) References Cited

U.S. PATENT DOCUMENTS

| | | | |
|---|---|---|---|
| 6,191,463 B1 | 2/2001 | Mitani et al. | |
| 7,038,252 B2 | 5/2006 | Saito et al. | |
| 7,508,015 B2 | 3/2009 | Saito et al. | |
| 7,859,021 B2 | 12/2010 | Kaneko | |
| 2005/0274948 A1 | 12/2005 | Tamura et al. | |
| 2007/0224710 A1* | 9/2007 | Palacios et al. | 438/12 |
| 2008/0180313 A1* | 7/2008 | Ikeda et al. | 342/175 |
| 2009/0146185 A1* | 6/2009 | Suh et al. | 257/194 |
| 2009/0278513 A1* | 11/2009 | Bahramian et al. | 323/217 |
| 2010/0044752 A1 | 2/2010 | Marui | |
| 2011/0103148 A1* | 5/2011 | Bhalla et al. | 365/185.18 |

FOREIGN PATENT DOCUMENTS

| | | |
|---|---|---|
| JP | 2005-244072 | 9/2005 |
| JP | 2009-76845 | 4/2009 |

OTHER PUBLICATIONS

Wang et al., "Enhancement-Mode Si3N4/AlGaN/GaN MISHFETs," IEEE Electron Device Letters, vol. 27, No. 10, Oct. 2006, pp. 793.*
Chen et al., "Charge Trapping and Detrapping Behavior of Fluorinated HfO2/SiON Gate Stacked nMOSFET," IEEE Electron Device Lett. V31, No. 11, pp. 1178-1180, Nov. 2010.*
Chinese Office Action mailed Jan. 24, 2014 for corresponding Application No. 201110416092.8, with English-language translation.

* cited by examiner

*Primary Examiner* — Eva Yan Montalvo
*Assistant Examiner* — Christopher Johnson
(74) *Attorney, Agent, or Firm* — Fujitsu Patent Center (57) ABSTRACT

A compound semiconductor device includes a compound semiconductor layer, a gate electrode disposed above the compound semiconductor layer, and a gate insulation film. The gate insulation film is interposed between the compound semiconductor layer and the gate electrode. The gate insulation film contains a fluorine compound at least in the vicinity of the interface with the compound semiconductor layer.

17 Claims, 10 Drawing Sheets

COMPOUND SEMICONDUCTOR DEVICE AND MANUFACTURE PROCESS THEREOF

CROSS-REFERENCE TO RELATED APPLICATIONS

This application is based upon and claims the benefit of priority from the prior Japanese Patent Application No. 2010-276317 filed on Dec. 10, 2010, the entire contents of which are incorporated herein by reference.

FIELD

This invention relates to a compound semiconductor device and a process of producing the same.

BACKGROUND

Nitride semiconductor devices utilize characteristics such as a high saturated electron velocity and a wide band gap and have been actively developed as high-voltage and high-output semiconductor devices. Regarding the nitride semiconductor devices, many reports on electric field effect transistors, in particular, high electron mobility transistors (HEMTs) have been published. In particular, an AlGaN/GaN.HEMT having an electron transit layer of GaN and an electron supply layer of AlGaN has drawn attention. In the AlGaN/GaN.HEMT, a strain occurs in AlGaN due to a difference between the lattice constants of GaN and AlGaN, and the piezoelectric polarization caused by this strain and the spontaneous polarization of AlGaN generate a high-density two-dimensional electron gas (2DEG). Consequently, a high-voltage and high-output can be realized.

Japanese Patent Laid-open Nos. 2009-76845 and 2005-244072 disclose technologies relating to the above.

SUMMARY

According to aspects of embodiments, a compound semiconductor device includes a compound semiconductor layer, a gate electrode disposed above the compound semiconductor layer, and a gate insulation film. The gate insulation film is interposed between the compound semiconductor layer and the gate electrode. The gate insulation film contains a fluorine compound at least in the vicinity of the interface with the compound semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments will be explained with reference to accompanying drawings.

A so-called MIS-type AlGaN/GaN.HEMT in which a gate electrode is disposed above a GaN layer and a gate insulation film is one type of AlGaN/GaN.HEMT. In this HEMT, so-called dangling bonds are present at defective sites and the end faces of the gate insulation film. The presence of dangling bonds is one principal cause of a change of 3 V or more in threshold voltage for operating a transistor and therefore causes a problem in that high transistor characteristics cannot be obtained.

Some embodiments will now be descried in detail with reference to the drawings. In the following embodiments, the structures of compound semiconductor devices will be described together with the production processes thereof.

Note that in the following drawings, some of structural members are not shown in their correct relative sizes and thicknesses, for convenience of illustration.

In a first embodiment, a MIS-type AlGaN/GaN.HEMT is disclosed as a compound semiconductor device.

FIGS. 1A to 1J are schematic cross-sectional views illustrating a process of producing the MIS-type AlGaN/GaN-.HEMT according to the first embodiment. For convenience of illustration, in FIGS. 1D to 1H, only the vicinity of the gate electrode is shown on a magnified scale.

Figure 1A:
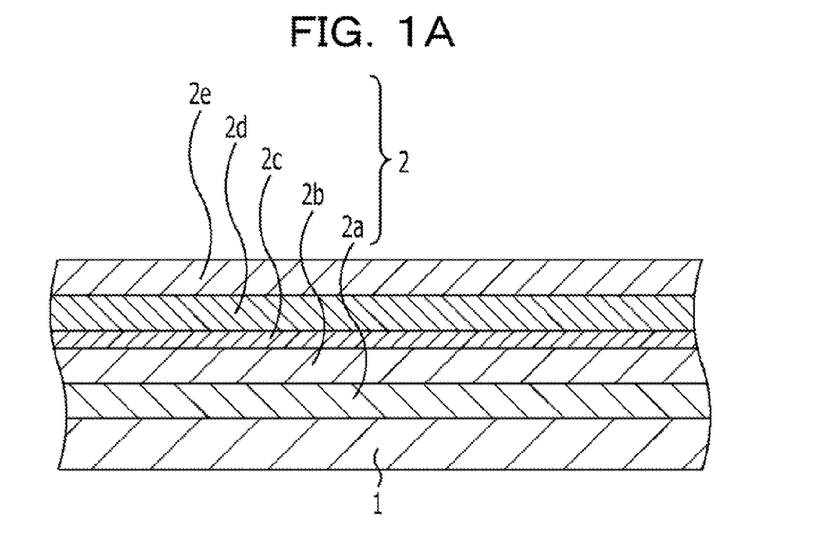
FIGS. 1A to 1J are schematic cross-sectional views illustrating a process of producing a MIS-type AlGaN/GaN-.HEMT according to a first embodiment.

As shown in FIG. 1A, a compound semiconductor layer 2 is formed on, for example, a semi-insulating SiC substrate 1 serving as a substrate for film growth. The compound semiconductor layer 2 is composed of a buffer layer 2a, an electron transit layer 2b, an intermediate layer 2c, an electron supply layer 2d, and a cap layer 2e. In the AlGaN/GaN.HEMT, a two-dimensional electron gas (2DEG) is generated in the vicinity of the interface between the electron transit layer 2b and the electron supply layer 2d (correctly, the intermediate layer 2c).

More specifically, the following compound semiconductors are grown on the SiC substrate 1 by, for example, a metal organic vapor phase epitaxy (MOVPE) method. Instead of the MOVPE method, a molecular beam epitaxy (MBE) method may be employed.

On the SiC substrate 1, the buffer layer 2a, the electron transit layer 2b, the intermediate layer 2c, the electron supply layer 2d, and the cap layer 2e are laminated by sequentially depositing AlN, i(intentionally undoped)-GaN, i-AlGaN, n-AlGaN, and n-GaN. In the growth of AlN, GaN, AlGaN, and GaN, gas mixtures of a trimethyl aluminum gas, a trimethyl gallium gas, and an ammonia gas are used as the raw material gases. Depending on a growing compound semiconductor layer, the presence or absence of supply and the flow rate of the trimethyl aluminum gas as an Al source or the trimethyl gallium gas as a Ga source are appropriately controlled. The flow rate of the ammonia gas serving as a common raw material is set to about 100 ccm to about 10 LM. In addition, the growth pressure is set to about 50 to 300 Torr, and the growth temperature is set to about 1000 to 1200° C.

When GaN and AlGaN are grown as n-types, GaN and AlGaN are doped with, for example, Si by adding, for example, a $SiH_4$ gas containing Si as an n-type impurity at a predetermined flow rate to the raw material gas. The doping concentration of Si is about $1\times10^{18}/cm^3$ to $1\times10^{20}/cm^3$, for example, about $5\times10^{18}/cm^3$.

Herein, the buffer layer 2a has a thickness of about 0.1 μm, the electron transit layer 2b has a thickness of about 3 μm, the intermediate layer 2c has a thickness of about 5 nm, the electron supply layer 2d has a thickness of about 20 nm and contains Al at a ratio of, for example, about 0.2 to 0.3, and the cap layer 2e has a thickness of about 10 nm.

Figure 1B:
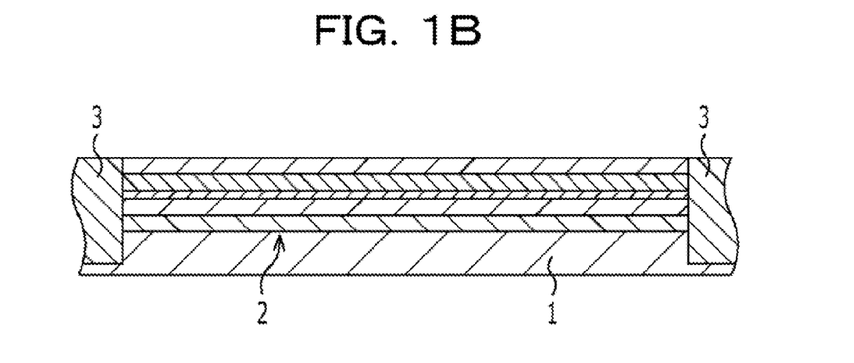

Subsequently, as shown in FIG. 1B, an element isolating structure 3 is formed.

More specifically, for example, argon (Ar) is injected to element isolating areas of the compound semiconductor layer 2. By doing so, the element isolating structure 3 is formed in the compound semiconductor layer 2 and the surface portion of the SiC substrate 1. The element isolating structure 3 defines each active area on the compound semiconductor layer 2.

The element isolation may be performed by, for example, a shallow trench isolation (STI) method, instead of the above-mentioned injection method.

Figure 1C:
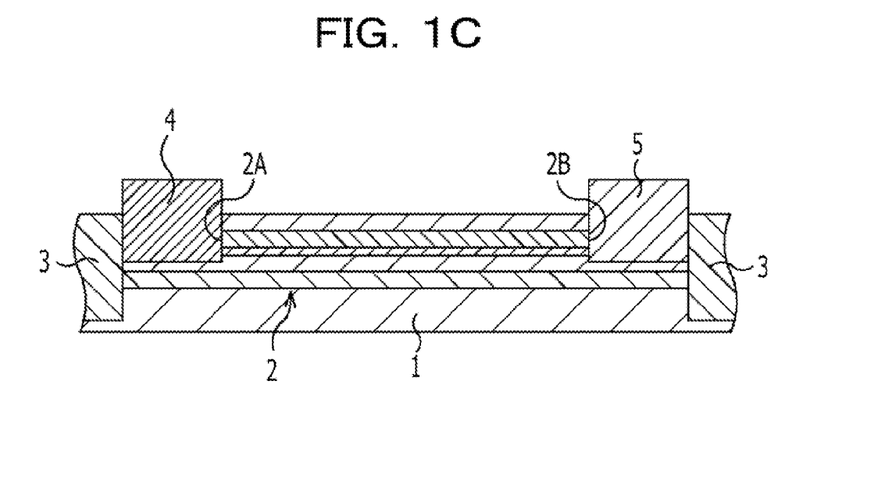

Subsequently, as shown in FIG. 1C, a source electrode 4 and a drain electrode 5 are formed.

More specifically, first, electrode grooves 2A and 2B are formed in the surface of the compound semiconductor layer 2 (e.g., in the cap layer 2e, the electron supply layer 2d, the intermediate layer 2c, and the surface portion of the electron transit layer 2b) at the positions where the source electrode and the drain electrode will be formed.

A resist mask is formed on the surface of the compound semiconductor layer 2 so as to have openings at the positions where the source electrode and the drain electrode will be formed. For example, the cap layer 2e, the electron supply layer 2d, the intermediate layer 2c, and the surface portion of the electron transit layer 2b are removed by dry etching using this resist mask. Consequently, the electrode grooves 2A and 2B are formed. In the dry etching, an inert gas such as Ar and a chlorine-based gas such as $Cl_2$ may be used as etching gases.

As the electrode materials, for example, Ti and Al are used. In the formation of the electrodes, for example, a two-layer resist with an eaves structure suitable for vapor deposition and a lift-off method is used. This resist is applied onto the compound semiconductor layer 2A as a resist mask having openings for the electrode grooves 2A and 2B. Titanium and aluminum are deposited using this resist mask so that the Ti film has a thickness of about 20 nm and the Al film has a thickness of about 200 nm. The resist mask with the eaves structure and Ti and Al deposited on the resist mask are removed by the lift-off method. Then, the SiC substrate 1 is thermally treated, for example, at about 550° C. in a nitrogen atmosphere, and the remaining Ti and Al are brought into an ohmic contact with the electron transit layer 2b. Thus, the electrode grooves 2A and 2B are filled with the lower portions of the Ti and Al films to form the source electrode 4 and the drain electrode 5.

Figure 1D:
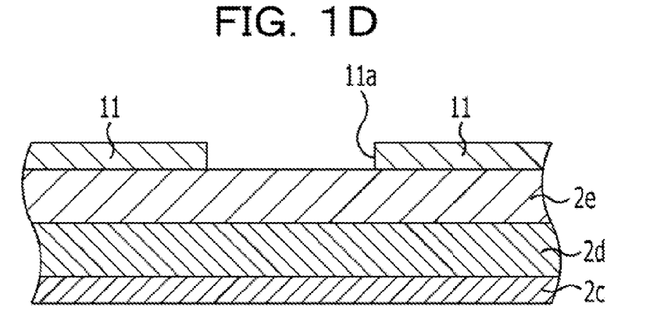

Subsequently, as shown in FIG. 1D, a resist mask 11 for forming an electrode groove of a gate electrode is formed.

More specifically, a resist is applied onto the compound semiconductor layer 2. The resist is processed by lithography to form an opening 11a at the position where the gate electrode will be formed. Thus, a resist mask 11 having the opening 11a from which the surface of the cap layer 2e on which the gate electrode will be formed is exposed is formed.

Figure 1E:
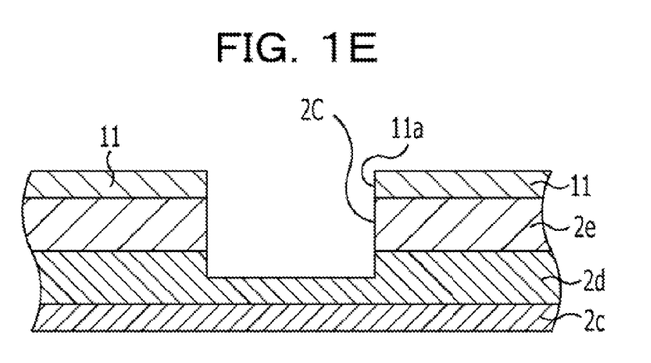

Subsequently, as shown in FIG. 1E, an electrode groove 2C is formed at the position where the gate electrode will be formed.

Using the resist mask 11, dry etching is performed to form a groove in the electron supply layer 2d in such a manner that the groove passes through the cap layer 2e. In the dry etching, for example, an inert gas such as Ar and a fluorine-based gas such as $CF_4$, $SF_6$, $C_2F_6$, $CHF_3$, or $F_2$ are used as etching gases. On this occasion, the remaining portion of the electron supply layer 2d has a thickness of about 0 to 20 nm, for example, about 1 nm. Consequently, the electrode groove 2C is formed.

The resist mask 11 is removed by, for example, ashing treatment.

Figure 1F:
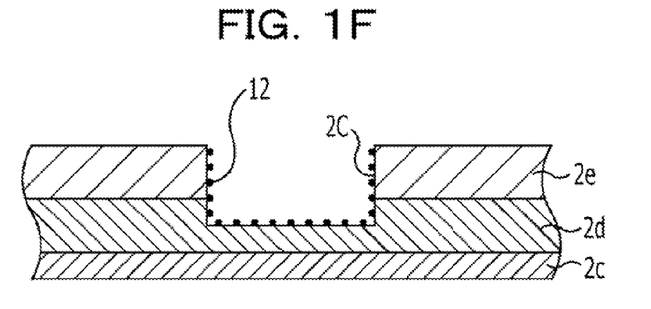

On this occasion, as shown in FIG. 1F, a residue 12 containing fluorine (F) remains on the inner surface (the bottom surface and the side surface) of the electrode groove 2C formed by dry etching using a fluorine-based gas. In general, this residue 12 is unnecessary and is therefore removed by, for example, wet etching using a predetermined chemical solution. However, in this embodiment, the residue 12 is intentionally left without removing it.

The electrode groove for the gate electrode may be formed by a procedure such as wet etching or ion milling, instead of the dry etching. However, in these cases, after formation of the electrode groove, fluoridization for applying a fluorine-containing material onto the inner surface of the electrode groove is necessary. The fluoridization may be performed by, for example, hydrofluoric acid treatment or plasma treatment using a fluorine-based gas.

Figure 1G:
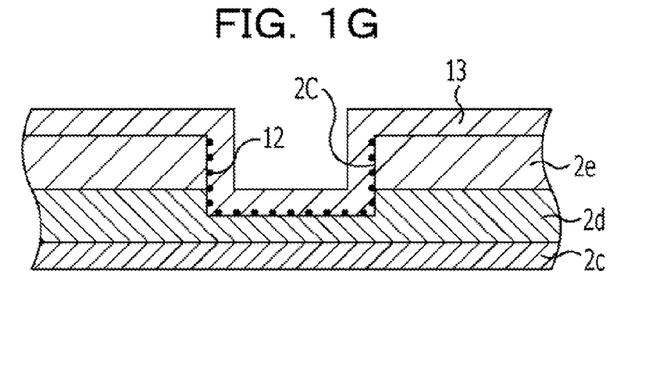

Subsequently, as shown in FIG. 1G, an $Al_2O_3$ film 13 is deposited.

More specifically, an insulating material such as $Al_2O_3$ is deposited on the compound semiconductor layer 2 so that an $Al_2O_3$ film 13 having a thickness of about 5 to 100 nm, in this embodiment, a thickness of about 40 nm covers the inner surface of the electrode groove 2C by, for example, an atomic layer deposition (ALD) method. The residue 12 is taken in the $Al_2O_3$ film 13 in the vicinity of the interface with the inner surface of the electrode groove 2C.

The deposition of $Al_2O_3$ may be performed by, for example, a CVD method, instead of the ALD method.

Figure 1H:
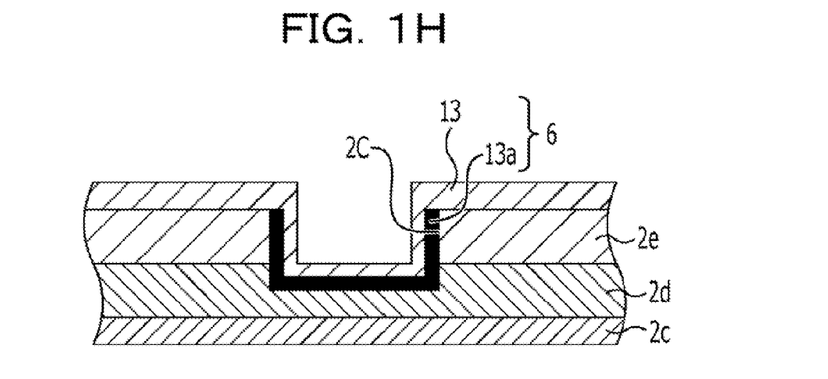

Subsequently, as shown in FIG. 1H, the $Al_2O_3$ film 13 is thermally treated to form a gate insulation film 6.

More specifically, the SiC substrate 1 is thermally treated at 500 to 1500° C., for example, at a high temperature of 900° C., for example, in a nitrogen atmosphere. This heat treatment is performed by increasing the temperature from room temperature to 400° C., from 400° C. to 700° C., and from 700° C. to 900° C. for a total heat treatment time of 1 to 20 minutes, for example, for 2 minutes, in order to reduce the likelihood and/or prevent overshoot of heat during the increase of temperature. By this heat treatment, fluorine (F) in the residue 12 diffuses inside the $Al_2O_3$ film 13 in the region containing the residue 12, that is, in the vicinity of the interface with the inner surface of the electrode groove 2C to form a composite layer 13a of $Al_2O_3$ and an Al—F compound in the $Al_2O_3$ film 13. It is suggested that, for example, AlOF is generated as the Al—F compound. The composite layer 13a is formed only in the lower region of the $Al_2O_3$ film 13 by diffusing F in the lower region of the $Al_2O_3$ film 13, preferably within a distance of 5 nm, by the heat treatment. By doing so, the gate insulation film 6 having a laminated structure of the composite layer 13a and the $Al_2O_3$ film 13 is formed. However, if fluorine atoms diffuse over a distance of 10 nm or more in the lower region of the $Al_2O_3$ film 13, the concentration of fluorine atoms diffused in the Al$_2$O$_3$ film 13 is decreased. Consequently, dangling bonds are not reduced.

When Al$_2$O$_3$ is deposited, dangling bonds are present in the inside and at the end faces of the Al$_2$O$_3$ film. In this embodiment, fluorine atoms in the residue 12 bond to the dangling bonds to generate an Al—F compound, and the composite layer 13a is formed only in the lower region of the Al$_2$O$_3$ film 13 on the inner surface of the electrode groove 2C by the heat treatment. Consequently, the dangling bonds in the Al$_2$O$_3$ film 13 are certainly reduced, and, thereby, a highly reliable gate insulation film 6, such that the change in threshold voltage can be suppressed to 1 V or less, is obtained. Furthermore, the electron trap is reduced by the inclusion of F in the gate insulation film 6, and the conduction band is raised by the piezoelectric charge of AlGaN. Consequently, the 2DEG in the electron transit layer 2b is reduced in the region (the region corresponding to a channel area) where the gate electrode is formed, which contributes to the certain realization of so-called normally-off operation in which current does not flow when the voltage is off. Furthermore, gate leakage is reduced with the decrease in conductivity of the Al$_2$O$_3$ film 13 due to the reduction in dangling bonds in the inside and at the end faces of the Al$_2$O$_3$ film 13, resulting in an improvement in transistor characteristics.

In addition, the composite layer 13a may be formed in the lower region of the Al$_2$O$_3$ film 13 on the cap layer 2e as well as in the lower region of the Al$_2$O$_3$ film 13 on the inner surface of the electrode groove 2C.

Figure 2A:
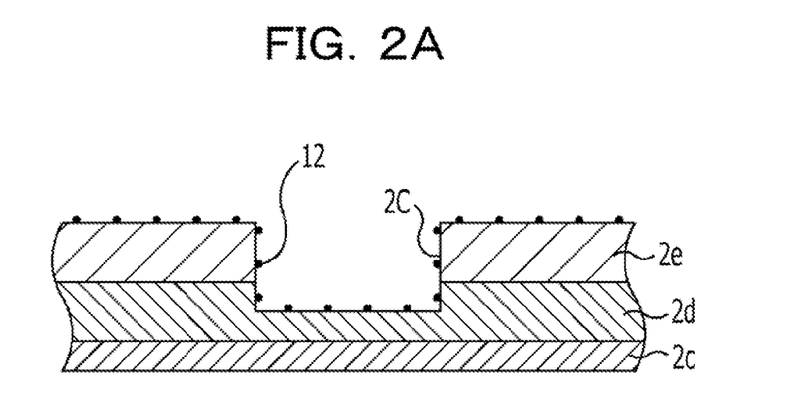
FIGS. 2A and 2B are schematic cross-sectional views illustrating another example according to the first embodiment.

In this case, in FIG. 1F, for example, the wet etching using a predetermined chemical solution is performed in such a manner that the residue 12 adhering to the inner surface of the electrode groove 2C is not completely removed (to leave a certain amount of the residue 12). By doing so, as shown in FIG. 2A, the residue 12 that has been removed from the inner surface of the electrode groove 2C re-adheres onto the cap layer 2e.

Figure 2B:
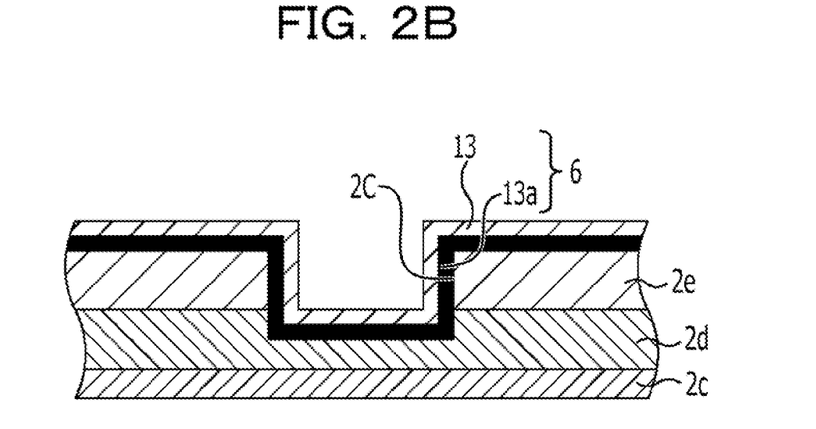

Furthermore, as in FIG. 1G, an Al$_2$O$_3$ film 13 is deposited, and heat treatment similar to that shown in FIG. 1H is performed. Consequently, as shown in FIG. 2B, a composite layer 13a is formed in almost the whole lower region of the Al$_2$O$_3$ film 13.

Figure 1I:
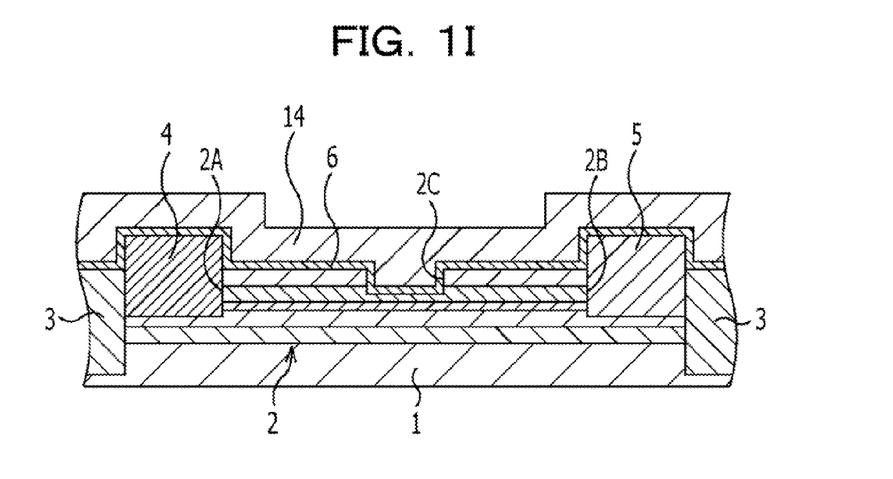

Subsequently, as shown in FIG. 1I, an Al film 14 is deposited.

More specifically, an electrode material, for example, Al, is deposited to form an Al film 14 having a predetermined thickness on the gate insulation film 6 by, for example, sputtering so that the electrode groove 2C is filled with the Al film 14. The Al film 14 is formed under conditions of, for example, a pressure of 0.7 Pa, an input power of 0.8 kW, and a target-substrate distance (T/S) of 150 mm.

Figure 1J:
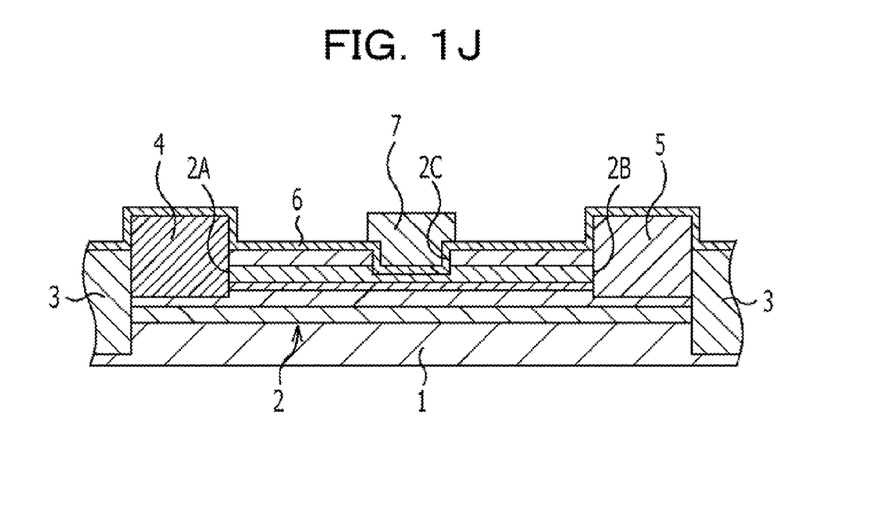

Subsequently, as shown in FIG. 1J, a gate electrode 7 is formed.

A resist mask covering the Al film 14 at the region corresponding to the position of the electrode groove 2C is formed, and the Al film 14 is dry etched using this resist mask. Consequently, the gate electrode 7 is formed so that the electrode groove 2C is filled with part of the Al film 14 as the gate electrode 7. By thus filling the electrode groove 2C with the gate electrode 7, the distance between the gate electrode 7 and the electron transit layer 2b is shortened to allow normally-off operation.

The gate electrode may be formed by depositing Ni/Au on the gate insulation film 6 by, for example, vapor deposition and then forming a Ni/Au gate electrode by a lift-off method, instead of depositing Al and patterning it as described above.

Thereafter, various steps such as formation of a protection film and formation of contacts of the source electrode 4, the drain electrode 5, and the gate electrode 7 are carried out to form a MIS-type AlGaN/GaN.HEMT.

As described above, according to this embodiment, the change in threshold voltage is suppressed by reducing the dangling bonds in the gate insulation film 6 for stabilization, and, thereby, a highly reliable AlGaN/GaN.HEMT having high transistor characteristics is realized.

In the first embodiment, Al$_2$O$_3$ is exemplified as the insulating material of the gate insulation film, but the following insulating materials may be used instead of Al$_2$O$_3$. That is, the gate insulation film may be formed by, for example, a nitride or oxynitride of Al, an oxide, nitride, or oxynitride of silicon (Si), an oxide, nitride, or oxynitride of hafnium (Hf), or may be a multilayer formed by insulating materials appropriately selected from the above.

When the gate insulation film is formed using a nitride or oxynitride of Al, the gate insulation film is formed so as to have a laminated structure composed of a composite layer and an Al nitride layer or an Al oxynitride layer. The composite layer contains an Al—F compound, formed on the interface with the inner surface of the electrode groove 2C, and an Al nitride or an Al oxynitride, and is formed only in the lower region of the gate insulation film.

When the gate insulation film is formed using an oxide, nitride, or oxynitride of Si, the gate insulation film is formed so as to have a laminated structure composed of a composite layer and a Si oxide layer, a Si nitride layer, or a Si oxynitride layer. The composite layer contains a Si—F compound, formed on the interface with the inner surface of the electrode groove 2C, and a Si oxide, a Si nitride, or a Si oxynitride, and is formed only in the lower region of the gate insulation film.

When the gate insulation film is formed using an oxide, nitride, or oxynitride of Hf, the gate insulation film is formed so as to have a laminated structure composed of a composite layer and a Hf oxide layer, a Hf nitride layer, or a Hf oxynitride layer. The composite layer contains a Hf—F compound, formed on the interface with the inner surface of the electrode groove 2C, and a Hf oxide, a Hf nitride, or a Hf oxynitride, and is formed only in the lower region of the gate insulation film.

In a second embodiment, a MIS-type AlGaN/GaN.HEMT is disclosed as a compound semiconductor device as in the first embodiment, but the structure of the gate insulation film is slightly different from that in the first embodiment.

Figure 3:
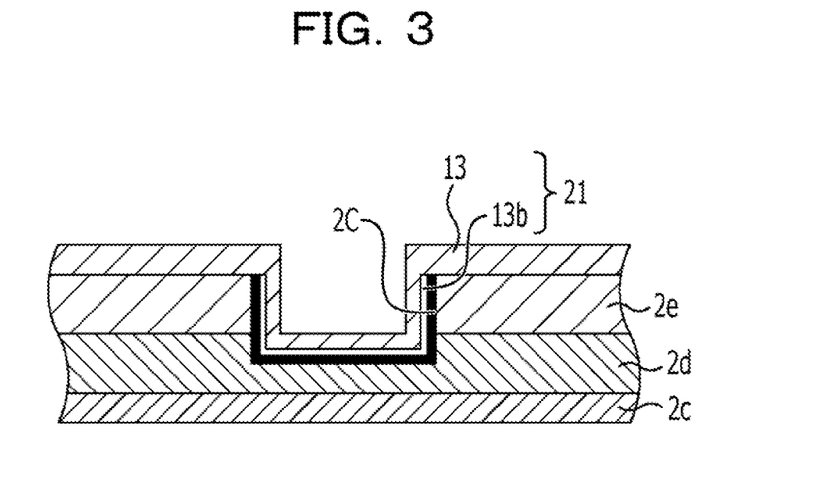
FIG. 3 is a schematic cross-sectional view illustrating a major step of a process of producing a MIS-type AlGaN/GaN.HEMT according to a second embodiment.

FIG. 3 is a schematic cross-sectional view illustrating a step of a process of producing a MIS-type AlGaN/GaN.HEMT according to the second embodiment.

First, as in the first embodiment, the steps shown in FIGS. 1A to 1G are carried out. Consequently, an insulating material, for example, an Al$_2$O$_3$ film 13 is deposited on the compound semiconductor layer 2 so as to cover the inner surface of the electrode groove 2C.

Subsequently, as shown in FIG. 3, the Al$_2$O$_3$ film 13 is thermally treated to form a gate insulation film 21.

More specifically, the SiC substrate 1 is thermally treated at 500 to 1500° C., for example, at a high temperature of 700° C., for example, in a nitrogen atmosphere. This heat treatment is performed by increasing the temperature from room temperature to 400° C. and from 400° C. to 700° C. for a total heat treatment time of 1 to 20 minutes, for example, for 2 minutes, in order to reduce the likelihood and/or prevent overshoot of heat during the increase of temperature. By this heat treatment, fluorine (F) in the residue 12 diffuses inside the Al$_2$O$_3$ film 13 in the region containing the residue 12, that is, in the vicinity of the interface with the inner surface of the electrode groove 2C to form a composite layer 13b of Al$_2$O$_3$ and an Al—F compound in the Al$_2$O$_3$ film 13. It is suggested that, for example, the Al—F compound generated is AlOF. In the composite layer 13b, F is stepwise diffused only in the lower region of the $Al_2O_3$ film 13 by the heat treatment so that the F concentration is gradually decreased from the interface with the inner surface of the electrode groove 2C toward the upper portion only in the lower region of the $Al_2O_3$ film 13. By doing so, a gate insulation film 21 having a laminated structure of the composite layer 13b and the $Al_2O_3$ film 13 is formed.

When $Al_2O_3$ is deposited, dangling bonds are present at the end faces of the $Al_2O_3$ film. In this embodiment, fluorine atoms in the residue 12 bond to the dangling bonds to generate an Al—F compound, and the composite layer 13b is formed only in the lower region of the $Al_2O_3$ film 13 on the inner surface of the electrode groove 2C by the heat treatment. Consequently, the dangling bonds in the $Al_2O_3$ film 13 are reduced to give a gate insulation film 21 that is highly reliable such that the change in threshold voltage can be suppressed to 1 V or less, for example.

In addition, the composite layer 13b may be formed in the lower region of the $Al_2O_3$ film 13 on the cap layer 2e as well as in the lower region of the $Al_2O_3$ film 13 on the inner surface of the electrode groove 2C.

In this case, in FIG. 1F, for example, the wet etching using a predetermined chemical solution is performed in such a manner that the residue 12 adhering to the inner surface of the electrode groove 2C is not completely removed (to leave a certain amount of the residue 12). By doing so, as shown in FIG. 2A, the residue 12 that has been removed from the inner surface of the electrode groove 2C re-adheres onto the cap layer 2e.

Figure 4:
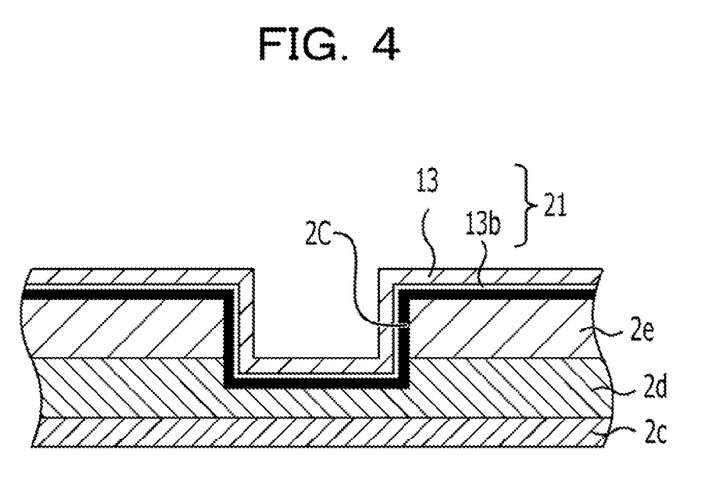
FIG. 4 is a schematic cross-sectional view illustrating another example according to the second embodiment.

Furthermore, as in FIG. 1G, an $Al_2O_3$ film 13 is deposited, and heat treatment similar to that shown in FIG. 3 is performed. Consequently, as shown in FIG. 4, a composite layer 13b is formed in almost the whole lower region of the $Al_2O_3$ film 13.

Thereafter, as in the first embodiment, a gate electrode 7 is formed through the steps shown in FIGS. 1I and 1J, and various steps such as formation of a protection film and formation of contacts of the source electrode 4, the drain electrode 5, and the gate electrode 7 are carried out to form a MIS-type AlGaN/GaN.HEMT.

As described above, according to this embodiment, the change in threshold voltage is suppressed by further reducing the dangling bonds in the gate insulation film 21 for stabilization, and, thereby, a highly reliable AlGaN/GaN.HEMT having high transistor characteristics is realized.

In the second embodiment, $Al_2O_3$ is exemplified as the insulating material of the gate insulation film, but the following insulating materials may be used instead of $Al_2O_3$. That is, the gate insulation film may be formed by, for example, a nitride or oxynitride of Al, an oxide, nitride, or oxynitride of Si, an oxide, nitride, or oxynitride of Hf, or may be a multi-layer formed by insulating materials appropriately selected from the above.

When the gate insulation film is formed using a nitride or oxynitride of Al, the gate insulation film is formed so as to have a laminated structure composed of a composite layer and an Al nitride layer or an Al oxynitride layer. The composite layer contains an Al—F compound and an Al nitride or an Al oxynitride and is formed only in the lower region of the gate insulation film. The composite layer is formed in such a manner that the F concentration therein is gradually decreased from the interface with the inner surface of the electrode groove 2C toward the upper portion of the $Al_2O_3$ film 13.

When the gate insulation film is formed using an oxide, nitride, or oxynitride of Si, the gate insulation film is formed so as to have a laminated structure composed of a composite layer and a Si oxide layer, a Si nitride layer, or a Si oxynitride layer. The composite layer contains a Si—F compound and a Si oxide, a Si nitride, or a Si oxynitride and is formed only in the lower region of the gate insulation film. The composite layer is formed in such a manner that the F concentration therein is gradually decreased from the interface with the inner surface of the electrode groove 2C toward the upper portion of the $Al_2O_3$ film 13.

When the gate insulation film is formed using an oxide, nitride, or oxynitride of Hf, the gate insulation film is formed so as to have a laminated structure composed of a composite layer and a Hf oxide layer, a Hf nitride layer, or a Hf oxynitride layer. The composite layer contains a Hf—F compound and a Hf oxide, a Hf nitride, or a Hf oxynitride and is formed only in the lower region of the gate insulation film. The composite layer is formed in such a manner that the F concentration therein is gradually decreased from the interface with the inner surface of the electrode groove 2C toward the upper portion of the $Al_2O_3$ film 13.

In a third embodiment, a MIS-type AlGaN/GaN.HEMT is disclosed as a compound semiconductor device as in the first embodiment, but the structure of the gate insulation film is slightly different from that in the first embodiment.

Figure 5:
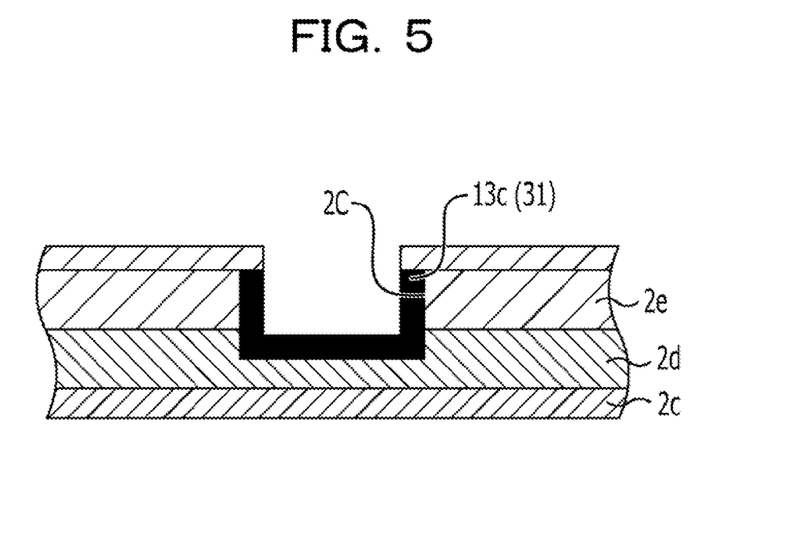
FIG. 5 is a schematic cross-sectional view illustrating a step of a process of producing a MIS-type AlGaN/GaN-.HEMT according to a third embodiment.

FIG. 5 is a schematic cross-sectional view illustrating a step of a process of producing a MIS-type AlGaN/GaN-.HEMT according to the third embodiment.

First, as in the first embodiment, the steps shown in FIGS. 1A to 1F are carried out. Consequently, an insulating material, for example, an $Al_2O_3$ film 13 is deposited on the compound semiconductor layer 2 so as to cover the inner surface of the electrode groove 2C.

Subsequently, as shown in FIG. 5, the $Al_2O_3$ film 13 is thermally treated to form a gate insulation film 31. More specifically, the SiC substrate 1 is thermally treated at 500 to 1500° C., for example, at a high temperature of 600° C., for example, in a nitrogen atmosphere. This heat treatment is performed by increasing the temperature from room temperature to 400° C. and from 400° C. to 600° C. for a total heat treatment time of 1 to 20 minutes, for example, for 1 minute, in order to reduce the likelihood and/or prevent overshoot of heat during the increase of temperature. By this heat treatment, F in the residue 12 diffuses inside the $Al_2O_3$ film 13 in the region containing the residue 12, that is, in the vicinity of the interface with the inner surface of the electrode groove 2C to form a composite layer 13c of $Al_2O_3$ and an Al—F compound in the $Al_2O_3$ film 13. It is suggested that, for example, the Al—F compound generated is AlOF. In the composite layer 13c, F is diffused in the entire region of the $Al_2O_3$ film 13 by the heat treatment so that the $Al_2O_3$ film 13 containing F in the entire region in the thickness direction is formed. Consequently, a gate insulation film 31 consisting of the composite layer 13c is formed.

When $Al_2O_3$ is deposited, dangling bonds are present at the end faces of the $Al_2O_3$ film. In this embodiment, fluorine atoms in the residue 12 bond to the dangling bonds to generate an Al—F compound, and F is diffused in the entire region of the $Al_2O_3$ film 13 on the inner surface of the electrode groove 2C by the heat treatment to form the composite layer 13c. Consequently, the dangling bonds in the $Al_2O_3$ film 13 are reduced to give a gate insulation film 31 that is highly reliable such that the change in threshold voltage can be suppressed to 1 V or less, for example.

In addition, the composite layer 13c may be formed in the region of the Al$_2$O$_3$ film 13 on the cap layer 2e as well as in the region of the Al$_2$O$_3$ film 13 on the inner surface of the electrode groove 2C.

In this case, in FIG. 1F, for example, the wet etching using a predetermined chemical solution is performed in such a manner that the residue 12 adhering to the inner surface of the electrode groove 2C is not completely removed (to leave a certain amount of the residue 12). By doing so, as shown in FIG. 2A, the residue 12 that has been removed from the inner surface of the electrode groove 2C re-adheres onto the cap layer 2e.

Figure 6:
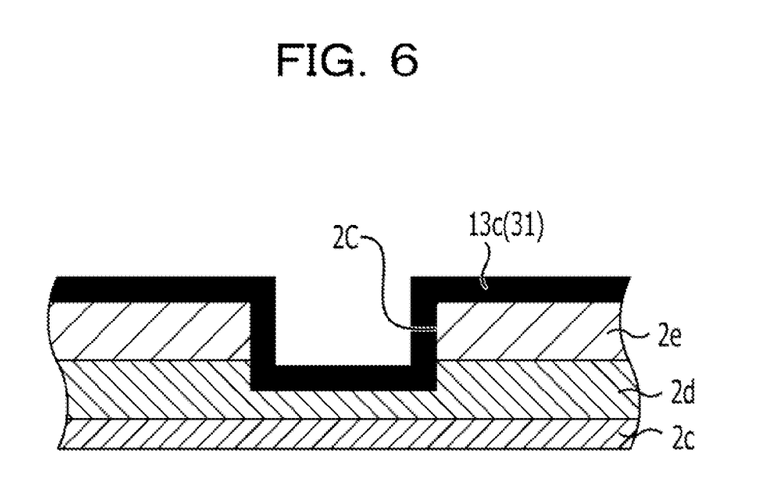
FIG. 6 is a schematic cross-sectional view illustrating another example according to the third embodiment.

Furthermore, as in FIG. 1G, an Al$_2$O$_3$ film 13 is deposited, and heat treatment similar to that shown in FIG. 5 is performed. Consequently, as shown in FIG. 6, almost the whole Al$_2$O$_3$ film 13 becomes a composite layer 13c.

Thereafter, as in the first embodiment, a gate electrode 7 is formed through the steps shown in FIGS. 1I and 1J, and various steps such as formation of a protection film and formation of contacts of the source electrode 4, the drain electrode 5, and the gate electrode 7 are carried out to form a MIS-type AlGaN/GaN.HEMT.

As described above, according to this embodiment, the change in threshold voltage is suppressed by further reducing the dangling bonds in the gate insulation film 31 for stabilization, and, thereby, a highly reliable AlGaN/GaN.HEMT having high transistor characteristics is realized.

In the third embodiment, Al$_2$O$_3$ is exemplified as the insulating material of the gate insulation film, but the following insulating materials may be used instead of Al$_2$O$_3$. That is, the gate insulation film may be formed by, for example, a nitride or oxynitride of Al, an oxide, nitride, or oxynitride of Si, an oxide, nitride, or oxynitride of Hf, or may be a multilayer formed by insulating materials appropriately selected from the above.

When the gate insulation film is formed using a nitride or oxynitride of Al, the gate insulation film is formed of a composite layer containing an Al—F compound and an Al nitride or an Al oxynitride in its entire region.

When the gate insulation film is formed using an oxide, nitride, or oxynitride of Si, the gate insulation film is formed of a composite layer containing a Si—F compound and a Si oxide, a Si nitride, or a Si oxynitride in its entire region.

When the gate insulation film is formed using an oxide, nitride, or oxynitride of Hf, the gate insulation film is formed of a composite layer containing a Hf—F compound and a Hf oxide, a Hf nitride, or a Hf oxynitride in its entire region.

A fourth embodiment discloses a power supply including one type of AlGaN/GaN.HEMT selected from those in the first to third embodiments.

Figure 7:
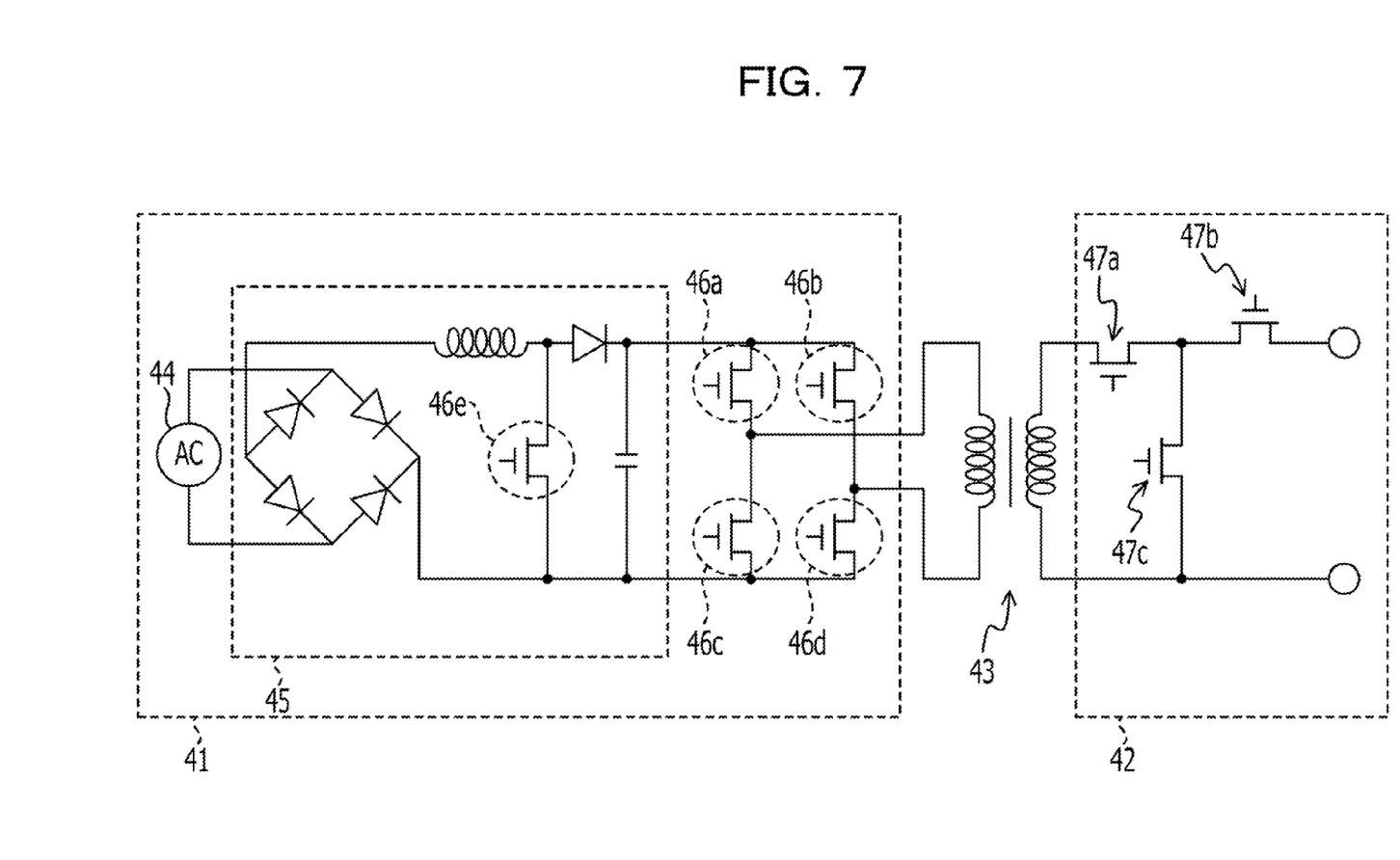
FIG. 7 is a coupling diagram schematically illustrating a structure of a power supply according to a fourth embodiment.

FIG. 7 is a coupling diagram schematically illustrating a structure of the power supply according to the fourth embodiment.

The power supply according to this embodiment includes a high-voltage primary circuit 41, a low-voltage secondary circuit 42, and a transformer 43 disposed between the primary circuit 41 and the secondary circuit 42.

The primary circuit 41 includes an AC power source 44, a bridge rectifier circuit 45, and a plurality of (herein, four) switching elements 46a, 46b, 46c, and 46d. The bridge rectifier circuit 45 has a switching element 46e.

The secondary circuit 42 includes a plurality of (herein, three) switching elements 47a, 47b, and 47c.

In this embodiment, the switching elements 46a, 46b, 46c, 46d, and 46e of the primary circuit 41 each include one type of AlGaN/GaN.HEMT selected from those in the first to third embodiments. On the other hand, the switching elements 47a, 47b, and 47c in the secondary circuit 42 each include a common MIS.FET made by using silicon.

In this embodiment, a highly reliable AlGaN/GaN.HEMT that can give high transistor characteristics by suppressing the change in threshold voltage through further reducing the dangling bonds in the gate insulation film for stabilization is applied to a high-voltage circuit. By doing so, a high-power power source circuit being highly reliable is realized.

A fifth embodiment discloses a high-frequency amplifier including one type of AlGaN/GaN.HEMT selected from those in the first to third embodiments.

Figure 8:
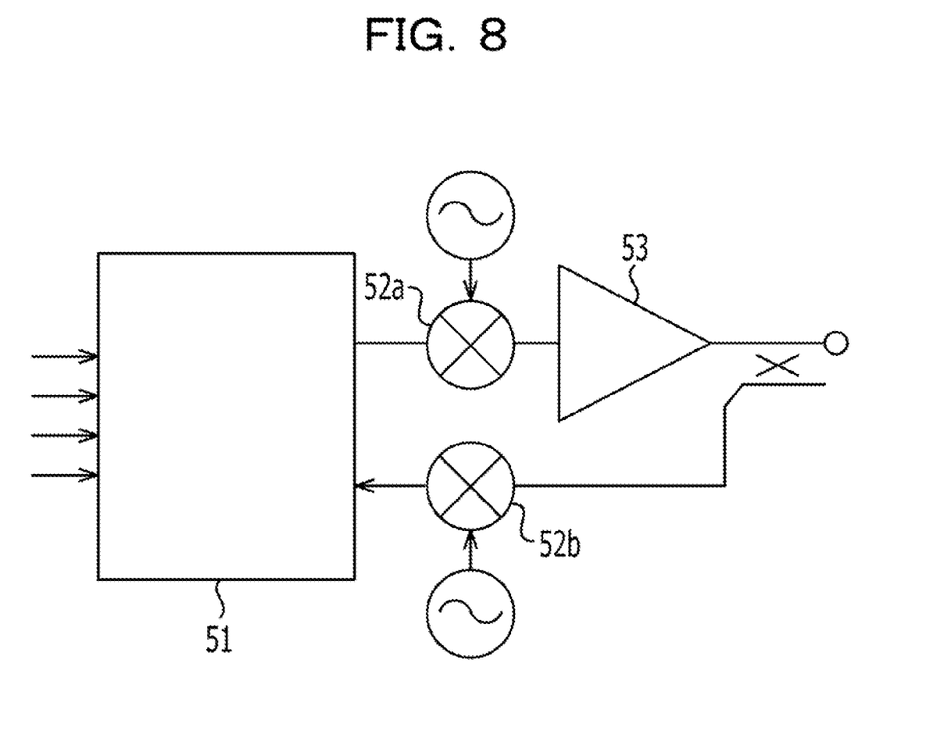
FIG. 8 is a coupling diagram schematically illustrating a structure of a high-frequency amplifier according to a fifth embodiment.

FIG. 8 is a coupling diagram schematically illustrating a structure of the high-frequency amplifier according to the fifth embodiment.

The high-frequency amplifier according to this embodiment includes a digital pre-distortion circuit 51, mixers 52a and 52b, and a power amplifier 53.

The digital pre-distortion circuit 51 compensates for nonlinear distortion of input signals. The mixer 52a mixes the input signal of which nonlinear distortion has been compensated and an AC signal. The power amplifier 53 amplifies the input signal mixed with the AC signal and has one type of AlGaN/GaN.HEMT selected from those in the first to third embodiments. In FIG. 8, the mixer 52b mixes an output signal with an AC signal by, for example, switching the switch and can transmit the output signal to the digital pre-distortion circuit 51.

In this embodiment, a highly reliable AlGaN/GaN.HEMT that can give high transistor characteristics by suppressing the change in threshold voltage through further certainly reducing the dangling bonds in the gate insulation film for stabilization is applied to a high-frequency amplifier. By doing so, a high-voltage high-frequency amplifier being highly reliable is realized.

In the first to fifth embodiments, AlGaN/GaN.HEMTs are exemplified as the compound semiconductor devices, but the following HEMTs may be applied as compound semiconductor devices instead of the AlGaN/GaN.HEMTs.

In Example 1 of another HEMT, an InAlN/GaN.HEMT is disclosed as a compound semiconductor device.

InAlN and GaN are chemical semiconductors that can adjust their lattice constants to be close to each other by controlling their compositions. In the first to fifth embodiments in this case, the electron transit layer is formed by i-GaN, the intermediate layer is formed by i-InAlN, the electron supply layer is formed by n-InAlN, and the cap layer is formed by n-GaN. In addition, in this case, since almost no piezoelectric polarization occurs, the two-dimensional electron gas is generated mainly by the spontaneous polarization of InAlN.

According to this example, as in the above-described AlGaN/GaN.HEMTs, the change in threshold voltage is suppressed by further reducing the dangling bonds in the gate insulation film for stabilization, and, thereby, a highly reliable InAlN/GaN.HEMT having high transistor characteristics is realized.

In Example 2 of another HEMT, an InAlGaN/GaN.HEMT is disclosed as a compound semiconductor device.

GaN and InAlGaN are compound semiconductors, and the later has a lattice constant smaller than that of the former. In the first to fifth embodiments in this case, the electron transit layer is formed by i-GaN, the intermediate layer is formed by i-InAlGaN, the electron supply layer is formed by n-InAlGaN, and the cap layer is formed by n$^+$-GaN.

According to this example, as in the above-described AlGaN/GaN.HEMTs, the change in threshold voltage is suppressed by reducing the dangling bonds in the gate insulation film for stabilization, and, thereby, a highly reliable InAlGaN/GaN.HEMT having high transistor characteristics is realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A compound semiconductor device comprising:
   a compound semiconductor layer;
   a gate electrode disposed above the compound semiconductor layer; and
   a gate insulation film interposed between the compound semiconductor layer and the gate electrode, the gate insulation film containing a fluorine compound,
   wherein the gate insulation film contains the fluorine compound in such a manner that the concentration of the fluorine compound gradually decreases from an interface between the compound semiconductor layer and the gate insulation film toward the upper surface of the gate insulation film in the thickness direction.

2. The compound semiconductor device according to claim 1, wherein the gate insulation film contains an oxide, nitride, or oxynitride of at least one selected from aluminum, and hafnium.

3. The compound semiconductor device according to claim 1, wherein the gate insulation film contains the fluorine compound in the entire region in the thickness direction.

4. The compound semiconductor device according to claim 1, wherein the gate electrode is disposed in such a manner that a groove formed in the compound semiconductor layer is filled with part of the gate electrode through the gate insulation film; and the gate insulation film contains the fluorine compound at least in the vicinity of the interface with the compound semiconductor layer in the groove.

5. A method of producing a compound semiconductor device, comprising:
   forming a compound semiconductor layer;
   etching the compound semiconductor layer to form a groove in the compound semiconductor layer;
   forming a gate insulation film on a compound semiconductor layer over the groove without removing a residue in the groove generated by the etching;
   thermally treating the residue and the gate insulation film formed by an insulating material so that the fluorine compound is contained in the vicinity of an interface between the compound semiconductor layer and the gate insulation film generated by the etching; and
   forming a gate electrode above the compound semiconductor layer and the gate insulation film.

6. The method of producing a compound semiconductor device according to claim 5, wherein the gate insulation film contains the fluorine compound in such a manner that the concentration of the fluorine compound gradually decreases from the interface toward the upper surface of the gate insulation film in the thickness direction.

7. The method of producing a compound semiconductor device according to claim 5, wherein the gate insulation film contains the fluorine compound in the entire region in the thickness direction.

8. The method of producing a compound semiconductor device according to claim 5, wherein the gate insulation film contains an oxide, nitride, or oxynitride of at least one selected from aluminum, and hafnium.

9. The method of producing a compound semiconductor device according to claim 5, wherein the gate electrode is formed in such a manner that a groove formed in the compound semiconductor layer is filled with part of the gate electrode; and the gate insulation film contains the fluorine compound at least in the vicinity of the interface with the compound semiconductor layer in the groove.

10. The method of producing a compound semiconductor device according to claim 9, wherein the groove is formed by dry etching using an etching gas containing fluorine; and the gate insulation film is formed by an insulating material under the conditions that a fluorine-containing etching residue adhering to the inner surface of the electrode groove is not completely removed after the dry etching so that the residue is left.

11. A power source circuit comprising:
    a transformer; and
    a high-voltage circuit and a low-voltage circuit having the transformer therebetween, the high-voltage circuit including transistors, the transistors each including:
    a compound semiconductor layer;
    a gate electrode disposed above the compound semiconductor layer; and
    a gate insulation film interposed between the compound semiconductor layer and the gate electrode, the gate insulation film containing a fluorine-compound,
    wherein the gate insulation film contains the fluorine compound in such a manner that the concentration of the fluorine compound gradually decreases from an interface between the compound semiconductor layer and the gate insulation film toward the upper surface of the gate insulation film in the thickness direction.

12. A high-frequency amplifier amplifying an input high-frequency voltage and outputting the amplified high-frequency voltage, the high-frequency amplifier comprising:
    a transistor that includes a compound semiconductor layer;
    a gate electrode disposed above the compound semiconductor layer; and
    a gate insulation film interposed between the compound semiconductor layer and the gate electrode, the gate insulation film contains a fluorine compound at-least in the vicinity of the interface with the compound semiconductor layer,
    wherein the gate insulation film contains the fluorine compound in such a manner that the concentration of the fluorine compound gradually decreases from an interface between the compound semiconductor layer and the gate insulation film toward the upper surface of the gate insulation film in the thickness direction.

13. The compound semiconductor device according to claim 1, wherein the gate insulation film contains the fluorine compound only in the vicinity of the interface with the compound semiconductor layer.

14. The compound semiconductor device according to claim 1, wherein the gate insulation film contains an oxide, nitride, or oxynitride of at least one selected from silicon, aluminum, and hafnium.

15. The method of producing a compound semiconductor device according to claim 5, wherein the gate insulation film contains the fluorine compound only in the vicinity of the interface with the compound semiconductor layer.

16. The method of producing a compound semiconductor device according to claim 5, wherein the gate insulation film contains an oxide, nitride, or oxynitride of at least one selected from silicon, aluminum, and hafnium.

17. The power source circuit according to claim 11, wherein the gate insulation film contains the fluorine compound only in the vicinity of the interface with the compound semiconductor layer.

* * * * *